(12) United States Patent
Nishi et al.

(10) Patent No.: US 11,586,897 B2
(45) Date of Patent: Feb. 21, 2023

(54) REINFORCEMENT LEARNING SYSTEM

(71) Applicant: KABUSHIKI KAISHA TOSHIBA, Minato-ku (JP)

(72) Inventors: Yoshifumi Nishi, Yokohama (JP); Radu Berdan, Shinagawa (JP); Takao Marukame, Chuo (JP); Kumiko Nomura, Shinagawa (JP)

(73) Assignee: KABUSHIKI KAISHA TOSHIBA, Minato-ku (JP)

( * ) Notice: Subject to any disclaimer, the term of this patent is extended or adjusted under 35 U.S.C. 154(b) by 947 days.

(21) Appl. No.: 16/291,400

(22) Filed: Mar. 4, 2019

(65) Prior Publication Data

US 2020/0005130 A1    Jan. 2, 2020

(30) Foreign Application Priority Data

Jul. 2, 2018    (JP) ................. 2018-125761

(51) Int. Cl.
*G06N 3/063*    (2006.01)
*G06N 3/04*    (2006.01)
(Continued)

(52) U.S. Cl.
CPC .......... *G06N 3/0635* (2013.01); *G06N 3/049* (2013.01); *G06N 3/08* (2013.01); *G11C 11/54* (2013.01); *G11C 13/0002* (2013.01)

(58) Field of Classification Search
CPC .......... G06N 3/08; G06N 20/00; G06N 3/063; G06N 3/0365; G06N 3/049; G06N 3/04
See application file for complete search history.

(56) References Cited

U.S. PATENT DOCUMENTS 8,892,487 B2    11/2014    Chang et al.
9,715,656 B1    7/2017    Gokmen
(Continued)

FOREIGN PATENT DOCUMENTS

JP    2014-504756    2/2014

OTHER PUBLICATIONS

Watkins et al., "Technical Note: Q-Learning," in Machine Learning 8, pp. 279-292 (Year: 1992).*
(Continued)

*Primary Examiner* — Ann J Lo
*Assistant Examiner* — Fen Christopher Tamulonis
(74) *Attorney, Agent, or Firm* — Oblon, McClelland, Maier & Neustadt, L.L.P.

(57) ABSTRACT

According to an embodiment, a reinforcement learning system includes a memristor array in which each of a plurality of first direction lines corresponds to one of a plurality of states, and each of a plurality of second direction lines corresponds to one of a plurality of actions, a first voltage application unit that individually applies voltage to the first direction lines, a second voltage application unit that individually applies voltage to the second direction lines, a action decision circuit that decides action to be selected by an agent in a state corresponding to a first direction line to which a readout voltage is applied, a action storage unit that stores action selected by the agent in each state that can be caused in an environment, and a trace storage unit that stores a time at which the state is caused by action selected by the agent.

7 Claims, 6 Drawing Sheets

(51) Int. Cl.
*G06N 3/08* (2006.01)
*G11C 13/00* (2006.01)
*G11C 11/54* (2006.01)
*G06N 3/049* (2023.01)

(56) References Cited

U.S. PATENT DOCUMENTS

2015/0170025 A1* 6/2015 Wu et al. ................. G06N 3/08
2017/0109628 A1   4/2017 Gokmen et al.

OTHER PUBLICATIONS

Ebong et al., "Iterative Architecture for Value Iteration using Memristors," in Proceedings of the 14th IEEE International Conference on Nanotechnology, Toronto, Canada, Aug. 18-21, 2014 (Year: 2014).*

Bozinovski S. Crossbar Adaptive Array: The first connectionist network that solved the delayed reinforcement learning problem. InArtificial Neural nets and Genetic Algorithms 1999 (pp. 320-325). Springer, Vienna. (Year: 1999).*

Vourkas et at., "Massively Parallel Analog Computing: Ariadne's Thread Was Made of Memristors," IEEE Transactions on Emerging Topics in Computing, vol. 6, No. 1, Mar. 2018 (Year: 2018).*

* cited by examiner

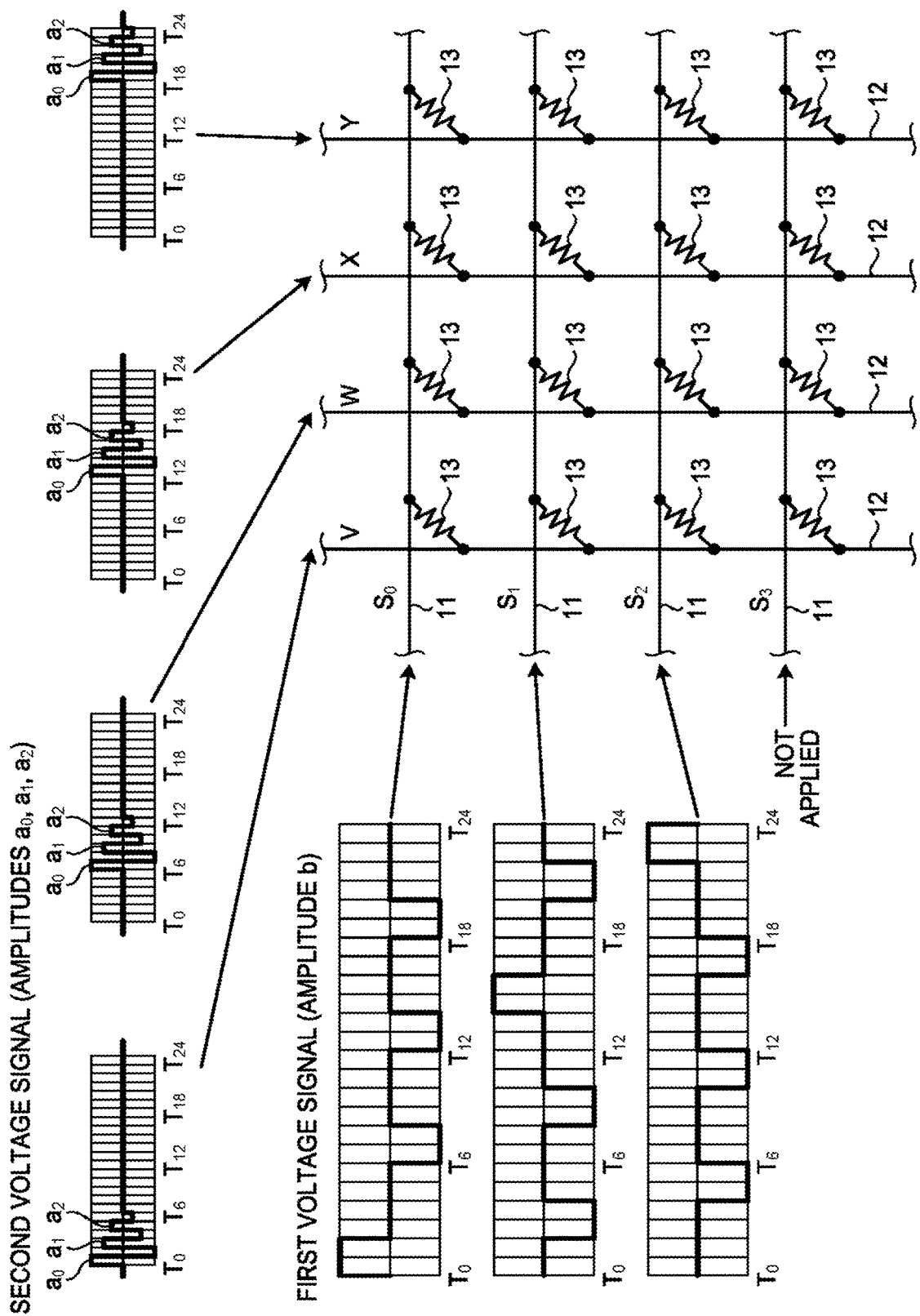

REINFORCEMENT LEARNING SYSTEM

CROSS-REFERENCE TO RELATED APPLICATIONS

This application is based upon and claims the benefit of priority from Japanese Patent Application No. 2018-125761, filed on Jul. 2, 2018; the entire contents of which are incorporated herein by reference.

FIELD

Embodiments described herein relate generally to a reinforcement learning system for performing reinforcement learning.

BACKGROUND

Recently, an artificial intelligent technique has been rapidly developed along with the progress of computer hardware represented by a graphical processing unit (GPU). In particular, an image recognition/classification technique represented by a convolutional neural network (CNN) has been already used in various scenes in the real world. On the other hand, among artificial intelligent techniques, reinforcement learning in which not only recognition and classification of signals are simply performed but also a system itself learns and smartens while repeating trials attracts attention. For example, the reinforcement learning is applied to an algorithm mounted in AlphaGo that has defeated a human professional go player.

In this manner, reinforcement learning in which a system itself can perform determination and operations that are based on creative and strategic thinking, by trial and error attracts attention as a basic technique of an edge device such as future autonomously operating mobility or a robot. Nevertheless, reinforcement learning requires complicated and enormous calculations. In other words, in reinforcement learning, action selection of an agent that corresponds to a state of an environment, and state transition of the environment that is caused by the action are repeated, and a probability of selecting the action in the environment is changed according to whether a desired result has been obtained, while tracing back the history of action selection and state transition. Thus, reinforcement learning requires large memory and calculation amount, and is difficult to be mounted on an edge in which a calculation resource and power consumption are restricted.

On the other hand, there is proposed a technique of causing a neural network to learn without individually accessing memristors, by forming the neural network like hardware using a crossbar memristor array, and devising a voltage sequence. Because parallelism of neural network learning can be enhanced by this technique, power consumption in learning can be considerably improved. Nevertheless, while this technique can perform learning of static data such as image recognition, this technique cannot be directly applied to reinforcement learning handling time-series data because it is necessary to trace back the history of action selection of an agent and state transition of an environment as described above.

BRIEF DESCRIPTION OF THE DRAWINGS

FIG. 7 is a diagram describing an overview of a learning manipulation in a second embodiment.

DETAILED DESCRIPTION

According to an embodiment, a reinforcement learning system includes a memristor array, a first voltage application unit, a second voltage application unit, a action decision circuit, a action storage unit, and a trace storage unit. The memristor array is a crossbar memristor array in which a plurality of first direction lines and a plurality of second direction lines are arranged in an intersectional manner, and memristors are provided at respective intersections, and is a memristor array in which each of the plurality of first direction lines corresponds to one of a plurality of states that can be caused in an environment, and each of the plurality of second direction lines corresponds to one of a plurality of actions that can be performed by an agent. The first voltage application unit is configured to individually apply voltage to the plurality of first direction lines. The second voltage application unit is configured to individually apply voltage to the plurality of second direction lines. The action decision circuit is configured to decide, based on magnitude of current flowing in the plurality of second direction lines when readout voltage is applied to one of the plurality of first direction lines, action to be selected by the agent in a state corresponding to the first direction line to which the readout voltage is applied. The action storage unit is configured to store, for each of the states that can be caused in the environment, action selected by the agent in a corresponding state. The trace storage unit is configured to store, for each of the states that can be caused in the environment, a time at which the environment enters a corresponding state.

Hereinafter, preferred embodiments of a reinforcement learning system according to the present invention will be described in detail with reference to the attached drawings.

Overview of Embodiment

First, together with a principle of reinforcement learning, a basic idea of the present embodiment will be described. The reinforcement learning is a machine learning algorithm in which, in a system in which an actor called an agent selects certain "action" in a certain "state", and the agent receives "reward" according to states of the environment and the agent that have been accordingly changed, the agent is caused to learn so as to take action for maximizing reward. In addition, action selection may be probabilistic or may be deterministic.

Figure 1:
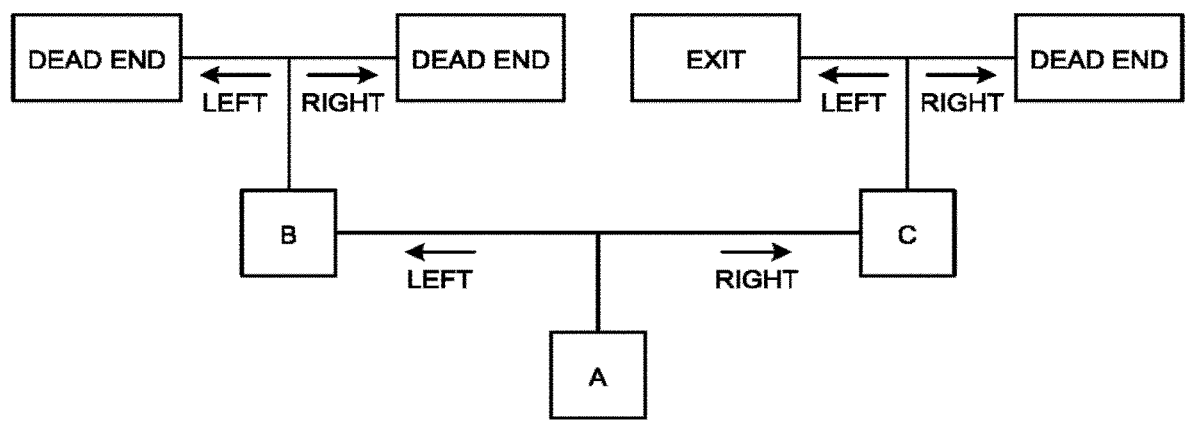
FIG. 1 is a diagram describing a principle of reinforcement learning.

For example, as in FIG. 1, an agent is assumed to reach an exit after repeating left and right divergences. First, the agent is assumed to depart from A, diverge to left, reach B, and then, diverge to left again, and reach a dead end.

Because a result of reaching the dead end is a result different from a purpose of reaching an exit, the agent obtains negative reward. Obtaining negative reward means that the past action selection was erroneous. In reinforcement learning, by referring to the history of the past action selection, learning is performed so as not to perform such action selection.

In this case, as causes of the negative reward, there are two causes including "divergence from B to left" that has been performed immediately before the negative reward is obtained, and "divergence from A to left" that has been performed before the divergence. In reinforcement learning, learning is performed assuming that "there is a high possibility that the action performed immediately before the reward is obtained is erroneous". Thus, learning is performed in such a manner that a possibility at which the agent does not diverge from B to becomes higher. On the other hand, there is a possibility that divergence from A to left is wrong, but a conclusion cannot be drawn yet. Thus, learning is performed in such a manner that a possibility at which the agent does not diverge to left becomes higher, but the learning is performed not so strongly as compared with that in the case of divergence from B. In addition, the word "possibility" here does not mean that action selection is probabilistic. In some cases, deterministic action selection is performed. Even in the case of deterministic action selection, because a parameter for performing action selection is unknown, it cannot be seen whether action selection always changes if a parameter is changed. Thus, the word "possibility" is used.

Next, if the agent departs from A again, because only weak learning is performed on divergence from A, the agent is assumed to similarly diverge to left and reach B again this time. Here, because learning is strongly performed so as not to diverge from B to left, the agent diverges from B to right. As a result, the agent reaches a dead end again and obtains negative reward as well. Similarly to the previous time, as causes of the negative reward, there are "divergence from B to right" and "divergence from A to left" that has been performed before the divergence. It is considered that there is a high possibility that the "divergence from B to right" that has been performed immediately before the reward is obtained is erroneous, and learning is strongly performed so as not to diverge to right. As for divergence from B, because learning is strongly performed so as not to diverge to left in the previous learning, the agent is considered to go back to the original in this learning. On the other hand, as for divergence from A, similarly to the previous time, learning is weakly performed so as not to diverge to left.

The agent is assumed to depart front A again after going through the above-described learning. As for the "divergence from A to left", weak learning has already been performed twice so that the divergence is less likely to be selected. Thus, a possibility at which the agent diverges from A to right and reaches C is made high. Thus, the agent is assumed to diverge from A to right and reach C. After that, when the agent diverges from C to left, the agent reaches the exit and obtains positive reward. In this case, the causes of the positive reward are "divergence from A to right" and "divergence from C to left". Thus, learning is performed in such a manner that these actions are selected at A and C. In a case where action selection of the agent is probabilistic, if trial is performed again, for example, rightward divergence is possibly performed at C and negative reward can be received. In this case, learning is performed so as to suppress "divergence from C to right". Learning for suppressing "divergence from A to right" is also performed, but the learning is weak as described above. Thus, there is a high possibility that the agent reaches the exit in the subsequent trial. If the agent reaches the exit again, positive reward is granted, and action selections of "divergence from A to right" and "divergence from C to left" are reinforced, and a possibility at which the agent reaches the exit becomes higher.

Figure 2:
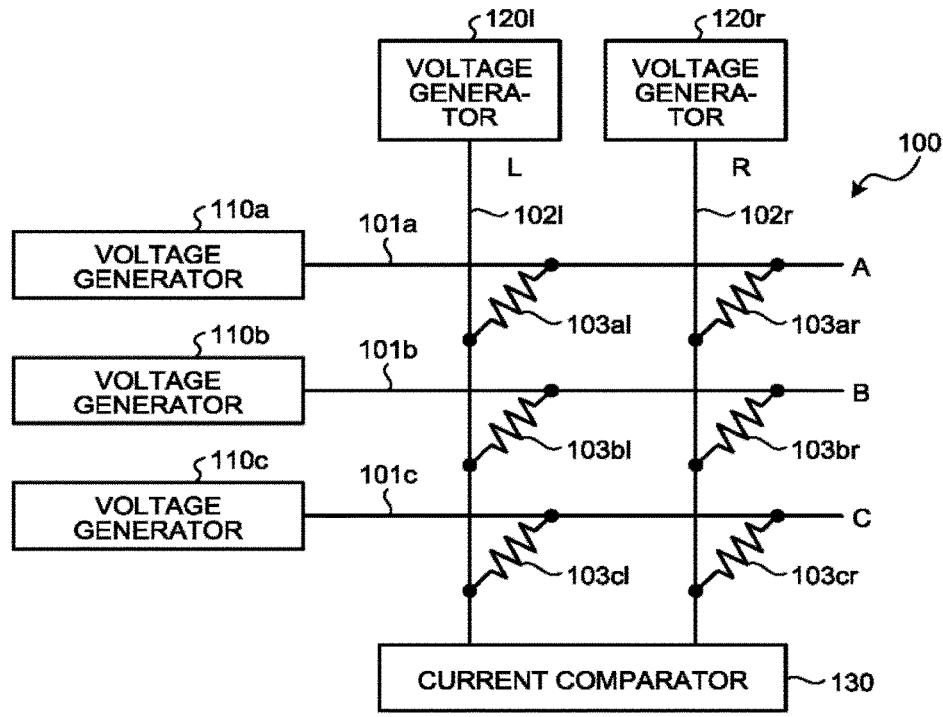
FIG. 2 is a diagram illustrating a configuration example of a memristor.

The present embodiment implements the above-described algorithm of reinforcement learning using a crossbar memristor array. FIG. 2 illustrates a configuration example of a memristor array corresponding to a simple case exemplified in FIG. 1. A the memristor array 100 illustrated in FIG. 2 has a configuration in which three horizontal lines 101a, 101b, and 101c corresponding to three states A, B, and C in the example in FIG. 1, and two vertical lines 102l and 102r corresponding to two types of action in the example in FIG. 1 (leftward divergence and rightward divergence) are arranged in an intersectional manner, and memristors 103al, 103ar, 103bl, 103br, 103cl, and 103cr are provided at respective intersections.

More specifically, the horizontal line 101a corresponding to the state A is electrically connected with the vertical line 102l corresponding to action of diverging to left, via the memristor 103al, and is electrically connected with the vertical line 102r corresponding to action of diverging to right, via the memristor 103ar. Similarly, the horizontal line 101b corresponding to the state B is electrically connected with the vertical line 102l corresponding to action of diverging to left, via the memristor 103bl, and is electrically connected with the vertical line 102r corresponding to action of diverging to right, via the memristor 103br. Similarly, the horizontal line 101c corresponding to the state C is electrically connected with the vertical line 102l corresponding to action of diverging to left, via the memristor 103cl, and is electrically connected with the vertical line 102r corresponding to action of diverging to right, via the memristor 103cr.

Voltage generators 110a, 110b, and 110c are respectively connected to the three horizontal lines 101a, 101b, and 101c, and are configured to individually apply voltages to these horizontal lines 101a, 101b, and 101c. In addition, voltage generators 120l and 120r are similarly connected to the two vertical lines 102l and 102r, and are configured to individually apply voltages to these vertical lines 102l and 102r. The two vertical lines 102l and 102r are connected to a current comparator 130 at end portions on the opposite side of end portions connected to the voltage generators 120l and 120r.

Figure 3:
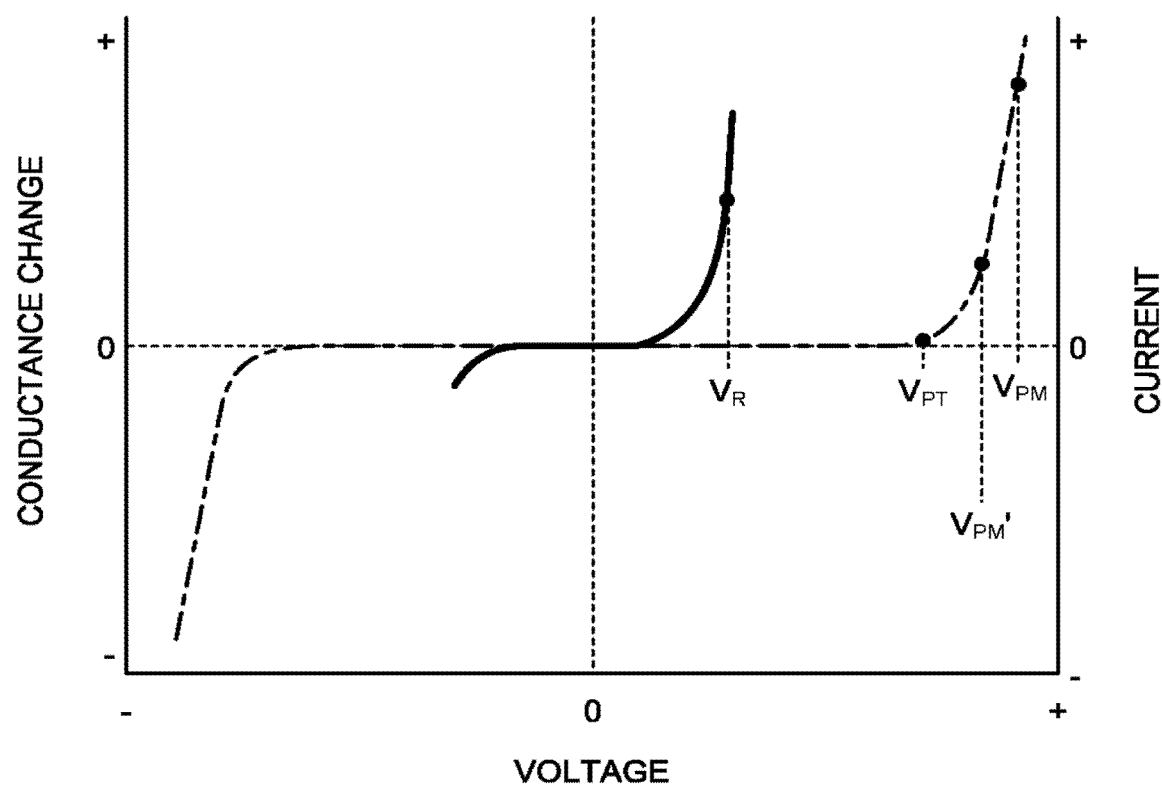
FIG. 3 is a diagram illustrating a property of a memristor.

FIG. 3 is a diagram illustrating a property of a typical memristor. Normally, when voltage is applied to a memristor, a nonlinear current-voltage property is shown, and when voltage larger than fixed voltage $V_{PT}$ (hereinafter, this will be referred to as threshold voltage) is applied, conductance (reciprocal ohm) changes. A thick line in the drawing indicates a current-voltage property of the memristor, and a dashed-dotted line indicates a change in conductance. FIG. 3 illustrates that, when positive large voltage is applied, conductance increases, and when negative large voltage is applied, conductance decreases. In the following description, it is assumed that, when current flowing in the memristor is read out, voltage $V_R$ (hereinafter, this will be referred to as readout voltage) smaller than the threshold voltage $V_{PT}$ is applied, and when conductance of the memristor is changed (ohmic value is changed), $\pm V_{PM}$ ($V_{PM} > V_{PT}$) is applied.

In an initial state, ohmic values of the memristor are assumed to be distributed at random. In the case of this example, in accordance with a situation in which the agent departs from A, the readout voltage $V_R$ is applied from the voltage generator 110a to the horizontal line 101a. At this time, the current comparator 130 having sufficiently low input impedance is connected to the vertical lines 102l and 102r, and the vertical lines 102l and 102r are substantially brought into a grounded state. In addition, the horizontal lines 101b and 101c are grounded. As a result, current flows to the vertical line 102l via the memristor 103al, rent flows to the vertical line 102r via the memristor 103ar, and these currents flows into the current comparator 130. Because resistance of the memristor is sufficiently large as compared with the impedance of the current comparator 130, current does not flow into the horizontal line 101b via the memristors 103bl and 103br, or current does not flow into the horizontal line 101c via the memristors 103cl and 103cr.

Magnitude of current flowing in the vertical line 102l and magnitude of current flowing in the vertical line 102r are compared in the current comparator. In a case where resistance of the memristor 103al is lower than resistance of the memristor 103ar, current flowing in the vertical line 102l becomes larger than current flowing in the line 102r. In response to this result, in FIG. 1, the agent diverges from A to left and moves to B.

When the agent reaches B, next, the readout voltage $V_R$ is applied from the voltage generator 110b to the horizontal line 101b, and the horizontal lines 101a and 101c are grounded. This time, current flows to the vertical line 102l via the memristor 103bl, current flows to the vertical line 102r via the memristor 103br, and magnitude of these currents are compared by the current comparator 130. In a case where resistance of the memristor 103bl is lower than resistance of the memristor 103br, current flowing in the vertical line 102l becomes larger than current flowing in the line 102r. In response to this result, in FIG. 1, the agent diverges from B to left and reaches a dead end. When the agent reaches the dead end, an operation of granting negative reward is performed.

Specifically, an ohmic value of the memristor 103bl is increased and an ohmic value of the memristor 103br is decreased so as to suppress action of diverging from B to left. As described above, because a memristor can control an ohmic value from the outside by applying voltage larger than the threshold voltage $V_{PT}$, by the memristor 103bl granting a voltage signal with appropriate magnitude and time to the horizontal line 101b and the vertical line 102l, and the memristor 103br granting a voltage signal with appropriate magnitude and time to the horizontal line 101b and the vertical line 102r, a potential difference $V_{PM}$ larger than the threshold voltage $V_{PT}$ can be granted to both ends of these memristors 103bl and 103br, and an ohmic value (conductance) can be changed. At this time, by granting voltage signals in such a manner that reverse polarity potential differences are generated in the memristor 103bl and the memristor 103br, one ohmic value can be increased and the other ohmic value can be decreased.

In addition, learning of increasing an ohmic value of the memristor 103al and decreasing an ohmic value of the memristor 103ar is also performed so as to suppress action of diverging from A to left. Also in this case, voltage signals are granted in such a manner that reverse polarity potential differences are generated in the memristor 103al and the memristor 103ar, but in this case, because learning needs to be weakly performed as described above, voltage signals that make the magnitude of the potential difference $V_{PM}'$ being smaller than $V_{PM}$ are granted. In other words, $V_{PT} < V_{PM}' < V_{PM}$.

In accordance with a situation in which the agent departs again from A after going through the above-described learning, the readout voltage $V_R$ is applied again to the horizontal line 101a, and the horizontal lines 101b and 101c are grounded. Ohmic values of the memristors 103al and 103ar are changed by the above-described learning, but change amounts are small because the learning is weak learning (potential difference $V_{PM}'$). Thus, if magnitude relation is assumed to be unchanged, current flowing in the vertical line 102l becomes larger than current flowing in the vertical line 102r similarly to the previous time. Thus, the agent diverges from A to left and moves to B.

When the agent reaches B, next, the readout voltage $V_R$ is applied from the voltage generator 110b to the horizontal line 101b, and the horizontal lines 101a and 101c are grounded. When the ohmic value of memristor 103bl is assumed to become larger than the ohmic value of the memristor 103br by the above-described learning, current flowing in the vertical line 102r becomes larger than current flowing in the vertical line 102l, and the agent diverges from B to right. Also in this case, the agent reaches dead end. Thus, negative reward is granted. In other words, for decreasing the ohmic value of the memristor 103bl and increasing the ohmic value of the memristor 103br, voltage having different polarities (magnitude is $V_{PM}$) are granted to them. At the same time, weak learning is performed by similarly granting voltage having different polarities (magnitude is $V_{PM}'$) so as to increase the ohmic value of the memristor 103al and decrease the ohmic value of the memristor 103ar so as to further suppress action of diverging from A to left.

By repeating such a learning manipulation, the ohmic value of the memristor 103ar eventually becomes smaller than the ohmic value of the memristor 103al, and when the readout voltage $V_R$ is applied to the horizontal line 101a, larger current flows in the vertical line 102r as compared with current flowing in the vertical line 102l. As a result, the agent diverges from A to right and reaches C. Thus, the readout voltage $V_R$ is applied to the horizontal line 101c this time. Here, when the ohmic value of the memristor 103cl is assumed to be smaller than the ohmic value of the memristor 103cr, larger current flows in the vertical line 102l as compared with current flowing in the vertical line 102r, and the agent diverges from C to left and reaches the exit.

When the agent reaches the exit, positive reward is granted. In other words, manipulation of decreasing the ohmic value of the memristor 103cl and increasing the ohmic value of the memristor 103cr by granting reverse polarity voltages $V_{PM}$ to the memristor 103cl and the memristor 103cr is performed, and the ohmic value of the memristor 103al is increased and the ohmic value of the memristor 103ar is decreased by granting reverse polarity voltages $V_{PM}'$ also to the memristor 103al and the memristor 103ar that have performed the past action selection. When positive reward is granted in this manner, a series of action selections starting from A to reach the exit is reinforced. Specifically, the ohmic value of the memristor 103al connecting to the horizontal line 101a is increased, the ohmic value of the memristor 103ar is decreased, the conic value of the memristor 103c connecting to the horizontal line 101c is decreased, and the ohmic value of the memristor 103cr is increased. A probability at which the agent reaches the exit can there by increased even in a case where disturbance is caused by noise or the like.

Hereinafter, a specific example of a reinforcement learning system to which the above-described basic concept of the present embodiment has been applied will be described.

First Embodiment

Figure 4:
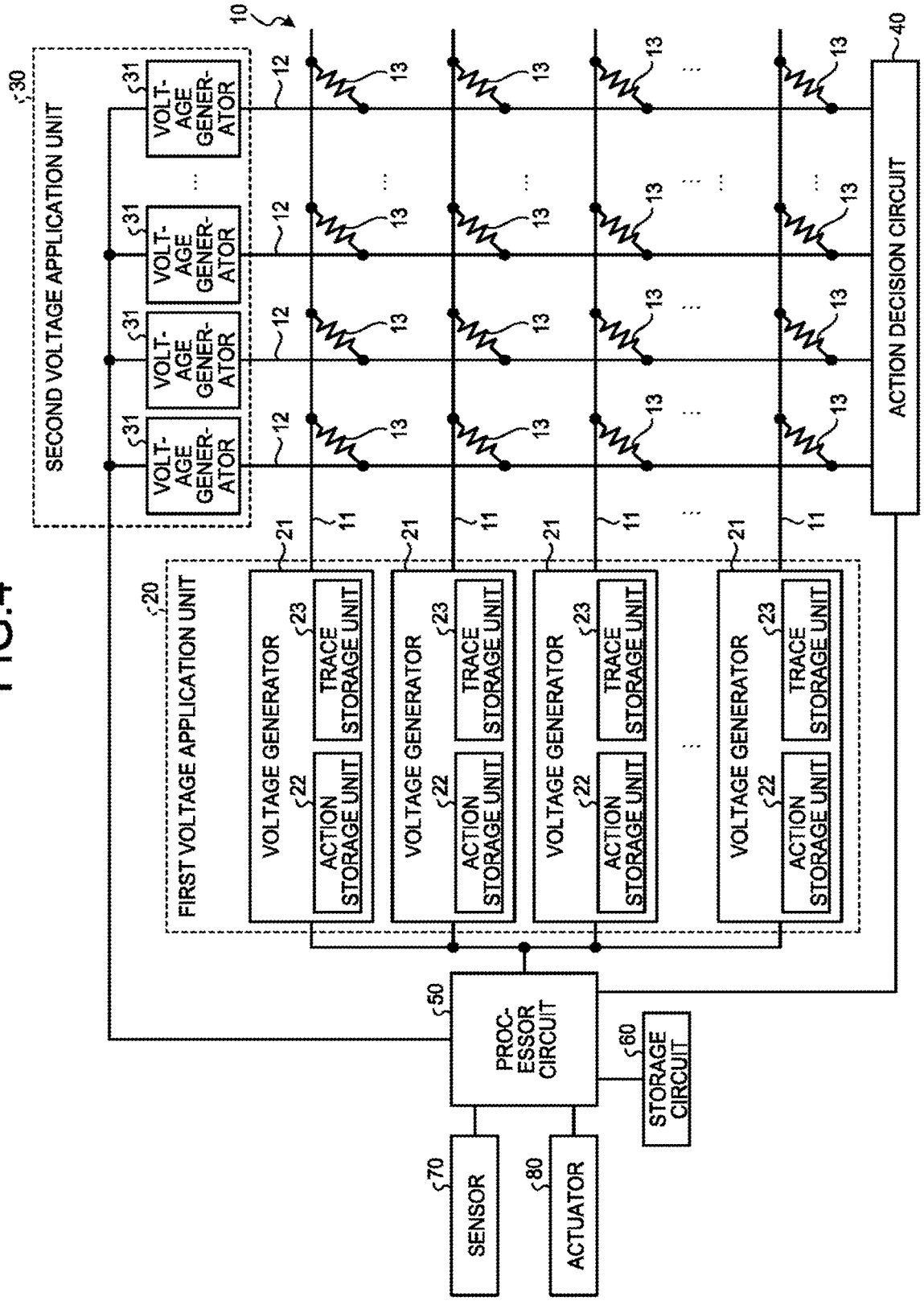
FIG. 4 is a diagram illustrating a configuration example of a reinforcement learning system according to an embodiment.

FIG. 4 is a diagram illustrating a configuration example of a reinforcement learning system according to the present embodiment. As illustrated in FIG. 4, the reinforcement learning system includes a crossbar the memristor array 10, a first voltage application unit 20, a second voltage application unit 30, a action decision circuit 40, a processor circuit 50, and a storage circuit 60. A sensor 70 for observing a "state" of an environment (or an agent) and an actuator 80 for implementing the "action" of the agent are connected to the processor circuit 50.

A memristor array 10 has a structure in which a plurality of horizontal lines 11 and a plurality of vertical lines 12 are arranged in an intersectional manner, and memristors 13 are provided at respective intersections. Similarly to the example illustrated in FIG. 2, in the memristor array 10, each of the plurality of horizontal lines 11 corresponds to one of a plurality of states that can be caused in the environment, and each of the plurality of vertical lines 12 corresponds to one of a plurality of actions that can be performed by the agent.

The first voltage application unit 20 is configured to individually apply voltage to the plurality of horizontal lines 11 of the memristor array 10. For example, as illustrated in FIG. 4, the first voltage application unit 20 includes a plurality of voltage generators 21 respectively connected to the plurality of horizontal lines 11. These voltage generators 21 applies the readout voltage $V_R$ to a corresponding the horizontal lines 11 in accordance with a command from the processor circuit 50, or applies a first voltage signal of a desired pattern, which will be described later, for changing an ohmic value (conductance) of each memristor 13 connected to a corresponding the horizontal lines 11, in learning.

In the present embodiment, a action storage unit 22 and a trace storage unit 23 are provided in each of the plurality of the voltage generators 21 connected to the plurality of horizontal lines 11.

The action storage unit 22 stores action selected by the agent when a corresponding state is caused, that is to say, stores action corresponding to a vertical line 12 in which the largest current flows, among the plurality of vertical lines 12, when the readout voltage $V_R$ is applied to a corresponding the horizontal lines 11. For example, if the agent is assumed to select action X when a state S is caused, information indicating the action X is stored into the action storage unit of the voltage generator 21 connected to a the horizontal lines 11 corresponding to the state S, among the plurality of horizontal lines 11.

The trace storage unit 23 stores a time at which the environment in in the state. For example, when the state is assumed to transition from S to S' by the agent selectin the action X at a time t, information indicating the time t is stored into the action storage unit 22 of the voltage generator 21 connected to a the horizontal lines 11 corresponding to the state S', among the plurality of horizontal lines 11.

Patterns of the first voltage signals to be applied to the horizontal lines 11 by the voltage generators 21 are decided referring to these action storage units 22 and trace storage units 23. In other words, when reward is granted (i.e. at the time of learning), the voltage generators 21 connected to the horizontal lines 11 corresponding to respective states caused so far refer to the action storage units 22 and the trace storage unit 23, and decide patterns of the first voltage signals to be applied to the horizontal lines 11, according to actions selected by the agent that are stored in the action storage units 22, times stored in the trace storage units 23, and polarity of reward.

In addition, in the present embodiment, the action storage units 22 and the trace storage units 23 corresponding to the respective states that can be caused in the environment are provided in the voltage generators 21 connected to the horizontal lines 11 corresponding to the respective states, but the action storage units 22 and the trace storage units 23 may be provided on the outside of the voltage generators 21, such as inside the processor circuit 50 or the storage circuit 60, for example. In this case, patterns of the first voltage signals to be applied to the horizontal lines 11 by the respective voltage generators 21 may be decided on the outside of the voltage generators 21, and commands for applying the first voltage signals of the decided patterns may be granted to the voltage generators 21. In addition, in a case where the action storage units 22 and the trace storage units 23 are provided on the outside of the voltage generators 21, one storage unit may function as these storage units without providing the action storage units 22 and the trace storage units 23 for the respective states, as long as states corresponding to information pieces stored in the action storage units 22 and the trace storage units 23 can be identified.

The second voltage application unit is configured to individually apply voltage to the plurality of vertical lines 12 of the memristor array 10. For example, as illustrated in FIG. 4, the second voltage applications unit 30 includes a plurality of voltage generators 31 respectively connected to the plurality of vertical lines 12. In learning, these voltage generators 31 apply second voltage signals of predetermined patterns to the plurality of respective vertical lines with temporal differences. As a result, in the memristor 13 provided at an intersection of the horizontal line 11 to which the first voltage signal been applied, and the vertical line 12 to which the second voltage signal has been applied, a potential difference corresponding to an overlap of the first voltage signal and the second voltage signal is generated between a terminal connecting to the horizontal line 11 and a terminal connecting to the vertical line 12. Conductance (ohmic value) of the memristor 13 changes according to the potential difference.

Based on magnitude of current flowing in the plurality of vertical lines 12 when the readout voltage $V_R$ is applied to one of plurality of horizontal lines 11, the action decision circuit 40 decides action to be selected by the agent in a state corresponding to the horizontal line 11 to which the readout voltage $V_R$ is applied. For example, a Winner-Take-All circuit can be used as the action decision circuit 40. The Winner-Take-All circuit is a circuit of selecting the maximum current from a plurality of current inputs, and a mounting method thereof is widely known. Generally, an input impedance of the Winner-Take-All circuit is as small as an ignorable level as compared with resistances of the memristors 13.

The processor circuit 50 controls operation of the reinforcement learning system according to the present embodiment. As the processor circuit 50, for example, a general-purpose processor such as a central processing unit (CPU) and a graphical processing unit (GPU), an application specific integrated circuit (ASIC), a programmable logic device (e.g. simple programmable logic device (SPLD), a complex programmable logic device (CPLD), a field programmable gate array (FPGA)), or the like can be used. By reading out a program saved in the storage circuit 60, for example, and executing the program, the processor circuit 50 implements a control function of the reinforcement learning system according to the present embodiment. In addition, instead of saving a program into the storage circuit 60, the program may be directly installed into the processor circuit 50. In this case, by reading out a program installed in a circuit and executing the program, the processor circuit 50 implements a control function of the reinforcement learning system according to the present embodiment.

The storage circuit 60 stores, as necessary, a program for implementing each control function of the processor circuit 50, and data associated with the program. As the storage circuit 60, for example, a Random Access Memory (RAM), a semiconductor memory element such as a flash memory, a hard disc, an optical disc, or the like can be used. In addition, the storage circuit 60 may be replaced with an external storage device of the reinforcement learning system according to the present embodiment. The storage circuit 60 may be a storage medium that stores or temporarily stores a program transmitted by a Local Area Network (LAN), the Internet, or the like, and downloaded. In addition, the number of storage media is not limited to one, and a storage medium may be formed by a plurality of media.

Next, an operation of the reinforcement learning system of the present embodiment that has the above-described configuration will be described. First, the agent is assumed to start action from the state S. In this case, the processor circuit 50 activates the action decision circuit 40, and then, instructs the voltage generator 21 connected to the horizontal line 11 corresponding to the state S, to apply the readout voltage $V_R$. In response to this, the voltage generator 21 connected to the horizontal line 11 corresponding to the state S stores the time t into the trace storage unit 23, and then, applies the readout voltage $V_R$ to the corresponding horizontal line 11. As described above, the readout voltage $V_R$ is voltage smaller than the threshold voltage $V_{PT}$ of the memristors 13, that is to say, voltage that causes readable current to flow in the memristors 13, but does not change ohmic values (conductance) of the memristors 13.

When the action decision circuit 40 is activated, the plurality of vertical lines 12 are grounded via the action decision circuit 40. Thus, by the readout voltage $V_R$ applied to the horizontal line 11 corresponding to the state S, current flows in the memristors 13 connected to the horizontal line 11, and flows into the action decision circuit 40 via the vertical lines 12. In addition, as described above, because resistances of the memristors 13 are sufficiently larger as compared with the input impedance of the action decision circuit 40, if the horizontal lines 11 other than the horizontal line 11 corresponding to the state S are grounded or brought into suspension, current does not flows into these horizontal lines 11.

The action decision circuit 40 compares magnitudes of currents flowing from the plurality of vertical lines 12, and selects a vertical line 12 in which the largest current is flowing. Here, the vertical line 12 corresponding to the action X is assumed to be selected. The action decision circuit 40 notifies the information to the processor circuit 50.

Based on the information notified from the action decision circuit 40, the processor circuit 50 controls an operation of the actuator 80 in such a manner that the agent performs the action X. In addition, the processor circuit 50 stores the action X into the action storage unit 22 of the voltage generator 21 line connected to the horizontal line 11 corresponding to the state S. In other words, information indicating that an ohmic value of the memristor 13 provided at an intersection with the vertical line 12 corresponding to the action X, among the memristors 13 connected to the horizontal line 11 corresponding to the state S, is the lowest is stored into the action storage unit 22.

State transition of the environment that is caused when the agent performs the action X is observed by information from the sensor 70. Here, the state of the environment transitions to the state S' at a time t+Δt by the agent performing the action X. In this case, the processor circuit 50 instructs the voltage generator 21 connected to the horizontal line 11 corresponding to the state S', to apply the readout voltage $V_R$. A manipulation similar to the above-described manipulation is thereby performed on the horizontal line 11 corresponding to the state S', the time t+Δt is stored into the trace storage unit 23, action X' corresponding to the vertical line 12 to which a memristor having the smallest ohmic value is connected, among the memristors 13 connected to the horizontal line 11 corresponding to the state S' is selected as action to be performed by the agent next, and the action X' is stored into the action storage unit 22. In addition, an operation of the actuator 80 is controlled in such a manner that the agent performs the action X', and the state further transitions to the next state.

In a case where the agent finally enters a state different from a purpose (e.g. in a case where the agent reaches the dead end in the example illustrated in FIG. 1), negative reward is granted in the following manner. In other words, as for the horizontal lines 11 corresponding to the respective states caused before the state different from the purpose is caused, ohmic values (conductance) of the memristors 13 connected to the horizontal lines 11 are changed in such a manner that actions stored in the action storage units 22 are less likely to be selected in the subsequent selection. For example, in a case where the agent selects the action X when the state S is caused, information indicating that an ohmic value of the memristor 13 provided at an intersection with the vertical line corresponding to 12 the action X is the lowest is stored in the action storage unit 22 of the voltage generator 21 connected to the horizontal line 11 corresponding to the state S. Thus, the voltage generator 21 applies, to the horizontal lines 11, the first voltage signal of such a pattern that the ohmic value of the memristor 13 increases and ohmic values of the other memristors 13 decrease. Specifically, this can be achieved by performing the following manipulation.

Figure 5:
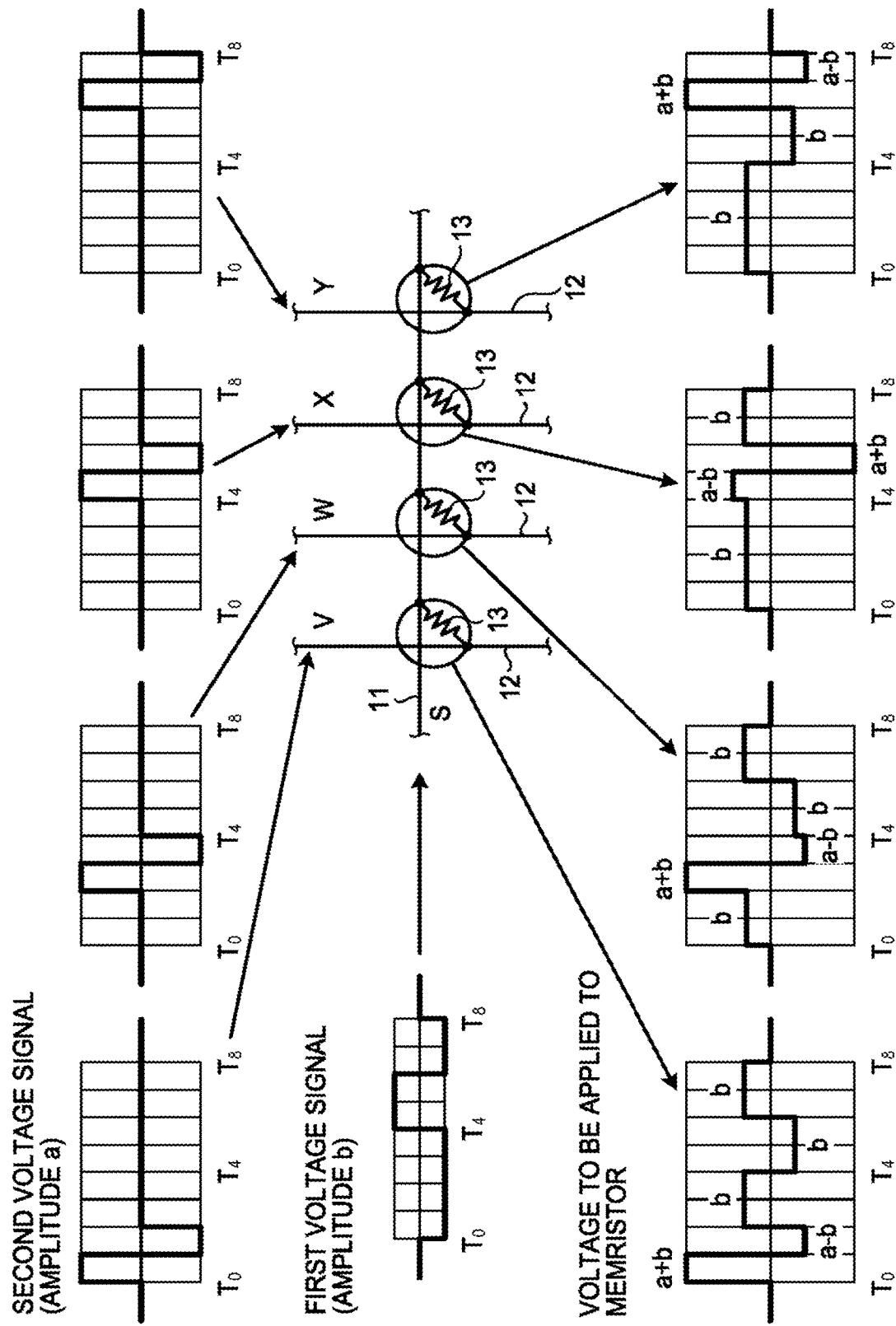
FIG. 5 is a diagram describing an overview of a learning manipulation in a first embodiment.

FIG. 5 is a diagram describing an overview of a learning manipulation in the present embodiment. Here, in a case where four vertical lines 12 corresponding to actions V, W, X, and Y intersects with the horizontal line 11 corresponding to the state S, and the memristors 13 are arranged at the respective intersections, a learning manipulation of increasing an ohmic value of the memristor 13 arranged at the intersection with the vertical line 12 corresponding to the action X, and decreasing ohmic values of the memristors 13 arranged at the intersections with the vertical lines 12 corresponding to the actions V, W, and Y will be considered.

As illustrated in FIG. 5, the voltage generators 31 connected to the four vertical lines 12 applies the second voltage signal of a predetermined pattern that has a waveform of a cycle 2T, to each of the vertical lines 12 with a temporal difference corresponding to 2T. In addition, the voltage generator 21 connected to the horizontal line 11 corresponding to the state S applies the first voltage signal of a pattern illustrated in FIG. 5, to a horizontal line 1. Here, the amplitude of the second voltage signal is denoted by a, and the amplitude of the first voltage signal is denoted by b. Here, by setting $a<V_{PT}$ and $b<V_{PT}$, unintended ohmic value changes of the other memristors 13 are prevented.

Because a potential difference (difference voltage) corresponding to an overlap of the first voltage signal and the second voltage signal is applied to both ends of the memristor 13, in the example in FIG. 5, positive voltage of a+b is applied to each of the memristors 13 arranged at the intersections with the vertical lines 12 corresponding to the actions V, W, and Y, and negative voltage with magnitude of a+b is applied only to the memristor 13 arranged at the intersection with the vertical line 12 corresponding to the action X. Accordingly, while ohmic values of the memristors 13 arranged at the intersections with the vertical lines 12 corresponding to the actions V, W, and Y decreases, an ohmic value of the memristor 13 arranged at the intersection with the vertical line 12 corresponding to the action X increases. Nevertheless, here, a+b>$V_{PT}$ and |a−b|<$V_{PT}$ need to be set.

In addition, here, the description has been given of a learning manipulation of increasing the ohmic value of the memristor 13 arranged at the intersection with the vertical line 12 corresponding to the action X, and decreasing the ohmic values of the memristors 13 arranged at the intersections with the vertical lines 12 corresponding to the actions V, W, and Y, but by reversing the positive/negative of the first voltage signal, the ohmic value of the memristor 13 arranged at the intersection with the vertical line 12 corresponding to the action X may be decreased, and the ohmic values of the memristors 13 arranged at the intersections with the vertical lines 12 corresponding to the actions V, W, and Y may be increased. This corresponds to positive reward.

Meanwhile, a time $t_s$ at which the state S is caused is stored in the trace storage unit 23 corresponding to the state S. If the time $t_s$ is a time slightly earlier than the present time, because action selection performed in the state S is considered to have strong connection with reward granted at the present time, the ohmic value of the memristor 13 needs to be largely changed. In contrast, if the time $t_s$ is distant past, because the action selection is considered to have weak connection with reward granted at the present time, there is no need to largely change the ohmic value of the memristor 13. For realizing this, it is necessary to set magnitude of the amplitude b of the first voltage signal to be applied to the horizontal line 11 corresponding to each state, in accordance with the history of state transition of the environment. Specifically, the following operation is performed.

Figure 6:
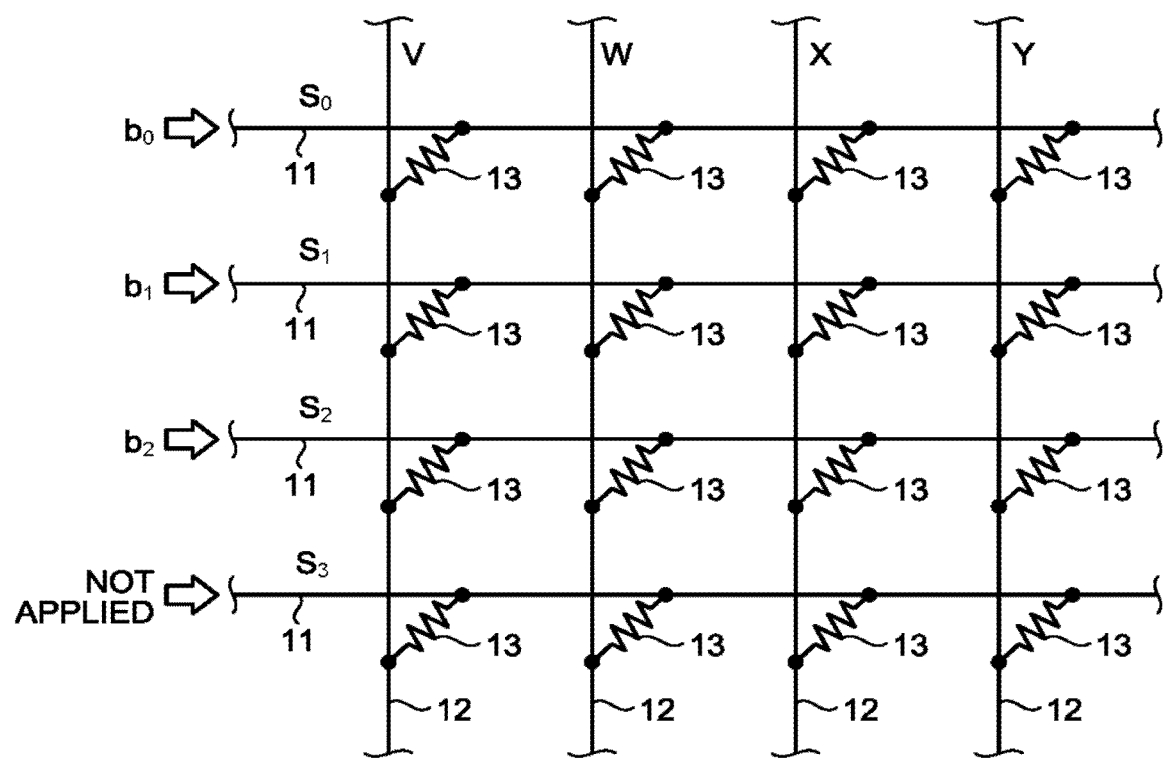
FIG. 6 is a diagram describing amplitude of a first voltage signal.

In the example in FIG. 5, states that can be caused in the environment are denoted by $S_0$, $S_1$, $S_2$, and $S_3$, and it is assumed that the state starts from the state $S_2$, transitions to the state $S_1$, and then, to the state $S_0$, and reward is granted when the state reaches the state $S_0$. It is assumed that the state $S_3$ is not caused. At this time, as illustrated in FIG. 6, amplitude of the first voltage signal to be applied to the horizontal line 11 corresponding to the state $S_0$ is denoted by $b_0$, amplitude of the first voltage signal to be applied to the horizontal line 11 corresponding to the state $S_1$ is denoted by $b_1$, and amplitude of the first voltage signal to be applied to the horizontal line 11 corresponding to the state $S_2$ is denoted by $b_2$. In addition, the first voltage signal is not applied to the horizontal line 11 corresponding to the state $S_3$. In addition, the second voltage signals with the amplitude a illustrated in FIG. 5 are assumed to be applied to the four vertical lines 12 corresponding to the actions V, W, X, and Y.

In this case, because the state $S_0$ is a state caused immediately before the reward is granted, an ohmic value of the corresponding memristor 13 needs to be increased. Thus, a+$b_0$ needs to be a large value. On the other hand, because the state is an initial state, a change in an ohmic value of the corresponding memristor 13 may be small. Thus, although a+$b_2$ needs to be a value larger than $V_{PT}$, it needs not be a so large value. In addition, while the first voltage signal is not applied to the horizontal line 11 corresponding to the state $S_3$, the second voltage signal is applied to each of the memristors 13 connected to the horizontal line 11. Because ohmic values of these memristors 13 should not be changed, the amplitude a of the second voltage signal needs to be smaller than $V_{PT}$ as described above. In addition, as illustrated in FIG. 5, voltage with a−b is applied to each of the memristors 13 connected to the horizontal lines 11 to which the first voltage signal is applied, but ohmic values of the memristors 13 should not be changed by the voltage (ohmic values of the memristors 13 need to be changed by voltage with a+b). Accordingly, in the case of the example illustrated in FIG. 6, a condition of being $V_{PT}$>$b_0$>$b_1$>$b_2$>$V_{PT}$−a, and $V_{PT}$>a is required.

Generally, in a case where the agent obtains reward after transitioning to N states $S_{N-1}$, $S_{N-2}$, ..., $S_1$, and $S_0$, when amplitudes of the first voltage signals to be applied to the horizontal lines 11 corresponding to the states $S_{N-1}$, $S_{N-2}$, ..., $S_1$, and $S_0$ are denoted by $b_{N-1}$, $b_{N-2}$, ..., $b_1$, and $b_0$, the amplitudes $b_{N-1}$, $b_{N-2}$, ..., $b_1$, and $b_0$ of these first voltage signals and the amplitude a of the second voltage signal need to satisfy a condition represented by the following formula (1).

$$V_{PT}>b_0>b_1> \ldots >b_{N-2}>b_{N-1}>V_{PT}-a>0 \tag{1}$$

The voltage generator 21 corresponding to each of the states $S_i$ caused before reward is granted decides amplitude $b_i$ of the first voltage signal based on a time $t_i$ stored in the trace storage unit 23, so as to satisfy the above-described formula (1), and decides a waveform of the first voltage signal according to the action stored in the action storage unit 22 and polarity of reward, and applies the first voltage signal to the corresponding horizontal line 11. In addition, at the same time, the voltage generator 31 corresponding to each action applies, to a corresponding vertical line 12, the second voltage signal of a predetermined pattern that has the amplitude a satisfying the above-described formula (1), with a temporal difference in such a manner that application timings do not overlap with the other vertical lines 12. Ohmic values of the memristors 13 needed to be changed in ohmic value according to reward can be thereby collectively changed. In other words, changes in ohmic values of the memristors 13 can be collectively performed by reinforcement learning.

In addition, in the present embodiment, the first voltage signals are assumed to be simultaneously applied to the horizontal lines 11 corresponding to the respective states $S_i$ caused before reward is granted, but the first voltage signals may be sequentially applied to the horizontal lines 11. In addition, in the present embodiment, the voltage generators 31 are respectively connected to the plurality of vertical lines 12, and these voltage generators 31 individually apply the second voltage signals to the vertical lines 12, but the second voltage signals generated by one voltage generator 31 may be delayed by a delay circuit, and sequentially applied to the plurality of vertical lines 12.

As described above, the reinforcement learning system according to the present embodiment includes the action storage unit 22 that stores, for each state that can be caused in the environment, action selected by the agent when a corresponding state is caused, the trace storage unit 23 that stores a time at which the environment enters the state, and the first voltage signal of a pattern having a waveform corresponding to action stored in the action storage unit 22 and polarity of reward, and having amplitude corresponding to the time stored in the trace storage unit 23 is applied to each of the horizontal lines 11 corresponding to the respective states caused before reward is granted. Accordingly, according to the reinforcement learning system according to the present embodiment, reinforcement learning with a simple structure and an operating principle that uses the memristor array 10 is enabled, and required memory and calculation amount can be reduced.

In particular, because the reinforcement learning system according to the present embodiment uses the crossbar memristor array 10, the reinforcement learning system can change ohmic values of the memristors 13 to be changed in ohmic value, by a collective manipulation, without individually accessing the respective memristors 13, by applying the second voltage signals to the plurality of vertical lines 12 with temporal differences as illustrated in FIG. 5, and applying the first voltage signals to the plurality of horizontal lines 11 with temporal differences as illustrated in FIG. 6.

Second Embodiment

Next, the second embodiment will be described. In the above-described first embodiment, magnitude of voltage to be applied to the memristors 13 is controlled by the amplitude b of the first voltage signal, but in the present embodiment, the magnitude is controlled by the amplitude a of the second voltage signal. In addition, because a configuration of the reinforcement learning system and a basic operation are similar to those in the above-described first embodiment, hereinafter, only a difference from the first embodiment will be described.

FIG. 7 is a diagram describing an overview of a learning manipulation in the resent embodiment. In the present embodiment, the voltage generators 31 of the second voltage application unit 30 respectively apply, to the vertical lines 12, the second voltage signals of patterns in which amplitudes oscillate while attenuating like $a_0 > a_1 > \ldots > a_{N-2} > a_{N-1}$. Here, N indicates the number of action selections to be traced back when reward is granted. In other words, up to Nth action selections are considered in reinforcement learning while tracing back from immediately before reward is obtained, but N+1th and earlier action selections are not considered assuming that these action selections are performed a long time ago and do not affect final reward. The patterns of the second voltage signals change to amplitude $a_{i+1}$ after oscillating at 1 cycle at each amplitude $a_i$. When an oscillation cycle at each amplitude is assumed to be 2T, the length of the pattern of the second voltage signal becomes 2NT.

The voltage generators connected to the respective vertical lines 12 apply the second voltage signals of the above-described pattern to the respective vertical lines 12 with temporal differences so as not to overlap the other vertical lines 12. For example, in a case where the second voltage signal of the above-described pattern is applied to the first vertical line 12 from the left at a time $T_0$, the second voltage signal is applied to the second vertical line 12 from the left at a time 2NT, the second voltage signal is applied to the third vertical line 12 from the left at a time 4NT, and the second voltage signal is applied to the mth vertical line 12 from the left at a time (m−1)2NT. In the example illustrated in FIG. 7, N=3 is set.

Hereinafter, similarly to the example described in the above-described first embodiment using FIG. 6, a case where states that can be caused in the environment are denoted by $S_0$, $S_1$, $S_2$, and $S_3$, the state starts from the state $S_2$, transitions to the state $S_1$, and then, to the state $S_0$, and reward is granted when the state reaches the state $S_0$ will be assumed, and a learning manipulation in the present embodiment will be described using FIG. 7. In this case, in the trace storage units 23 and the action storage units 22 corresponding to the respective states $S_0$, $S_1$, and $S_2$, times at which the states are caused, and actions selected by the agent in the states (the memristor 13 having the lowest ohmic value) are respectively stored.

First, the state $S_0$ will be considered. Because the state $S_0$ is a state caused immediately before the reward is granted, an ohmic value of the memristor 13 connected to horizontal line 11 corresponding to the state $S_0$ needs to be largely changed. Thus, the voltage generator 21 corresponding to the state $S_0$ applies, to the horizontal line 11 corresponding to the state $S_0$, the first voltage signal for applying voltage with the amplitude b at a timing corresponding to the amplitude $a_0$ of the second voltage signal. Specifically, the first voltage signal of the pattern that generates voltages with the amplitude b at times $T_0$ to $T_2$, $T_6$ to $T_8$, $T_{12}$ to $T_{14}$, and $T_{18}$ to $T_{20}$, and sets voltage to 0 in other times is applied to the horizontal line 11.

Voltage with the amplitude b of the first voltage signal in times $T_0$ to $T_2$ overlaps voltage with the amplitude $a_0$ of the second voltage signal at the intersection with the vertical line 12 corresponding to the action V, and voltage of $a_0+b$ at most is applied to the memristor 13 arranged at the intersection. Similarly, voltages with the amplitude b of the first voltage signals in times time $T_6$ to $T_8$, $T_{12}$ to $T_{14}$, and $T_{18}$ to $T_{20}$ overlap voltage with the amplitude $a_0$ of the second voltage signal at the intersections with the vertical lines 12 corresponding to the actions W, X, and Y and voltages of $a_0+b$ at most are applied to the memristors 13 arranged at the intersections. Here, if $a_0+b>V_{PT}$, ohmic values of these memristors 13 are changed. If only an ohmic value of the memristor 13 at the intersection with the vertical line 12 corresponding to the action V is desired to be changed, and ohmic values of the other memristors 13 are desired to be decreased, it is only required that only voltage with the amplitude b at the times $T_0$ to $T_2$ is set to positive voltage, and the voltages with the amplitude b at the times $T_6$ to $T_8$, $T_{12}$ to $T_{14}$, and $T_{18}$ to $T_{20}$ are set to negative voltages. The positive/negative of voltage with the amplitude b in the first voltage signal is decided based on information stored in the action storage unit 22 corresponding to the state $s_0$, and an attribute of reward to be granted.

Because the state $S_1$ is caused before the state $S_0$, a change range of the ohmic value of the memristor 13 connected to the horizontal line 11 corresponding to the state $S_1$ needs to be smaller than a change range of an ohmic value of the memristor 13 connected to the horizontal line 11 corresponding to the state $S_0$. Thus, the voltage generator 21 corresponding to the state $S_1$ applies, to the horizontal line 11 corresponding to the state $S_1$, the first voltage signal for applying voltage with the amplitude b at a timing corresponding to the amplitude $a_1$ of the second voltage signal. Specifically, the first voltage signal of the pattern that generates voltages with the amplitude b at times $T_2$ to $T_4$, $T_8$ to $T_{10}$, $T_{14}$ to $T_{16}$, and $T_{20}$ to $T_{22}$, and sets voltage to 0 in other times is applied to the horizontal line 11.

Voltage with the amplitude b of the first voltage signal in times $T_2$ to $T_4$ overlaps voltage with the amplitude $a_1$ of the second voltage signal at the intersection with the vertical line 12 corresponding to the action V, and voltage of $a_1+b$ at most is applied to the memristor 13 arranged at the intersection. Similarly, voltages with the amplitude b of the first voltage signals in times $T_8$ to $T_{10}$, $T_{14}$ to $T_{16}$, and $T_{20}$ to $T_{22}$ overlap voltage with the amplitude $a_1$ of the second voltage signal at the intersections with the vertical lines 12 corresponding to the actions W, X, and Y and voltages of $a_1+b$ at most are applied to the memristors 13 arranged at the intersections. Here, if $a_1+b>V_{PT}$, ohmic values of these memristors 13 are changed, but $a_1<a_0$ is set. Thus, a change range of ohmic values of these memristors 13 becomes smaller than a change range of ohmic values of the memristors 13 connected to the horizontal line 11 corresponding to the state $S_0$. If only an ohmic value of the memristor 13 at the intersection with the vertical line 12 corresponding to the action X is desired to be changed, and ohmic values of the other memristors 13 are desired to be decreased, it is only required that only voltage with the amplitude b at the times $T_{14}$ to $T_{16}$ is set to positive voltage, and the voltages with the amplitude b at the times $T_2$ to $T_4$, $T_8$ to $T_{10}$, and $T_{20}$ to $T_{22}$ are set to negative voltages. The positive/negative of voltage with the amplitude b in the first voltage signal is decided based on information stored in the action storage unit 22 corresponding to the state $s_1$, and an attribute of reward to be granted.

Because the state $S_2$ is caused before the state $S_1$, a change range of the ohmic value of the memristor 13 connected to the horizontal lines 11 corresponding to the state $S_2$ needs to be smaller than a change range of an ohmic value of the memristor 13 connected to the horizontal lines 11 corresponding to the state $S_1$. Thus, the voltage generator 21 corresponding to the state $S_2$ applies, to the horizontal line 11 corresponding to the state $S_2$, the first voltage signal for applying voltage with the amplitude b at a timing corresponding to the amplitude $a_2$ of the second voltage signal. Specifically, the first voltage signal of the pattern that generates voltages with the amplitude b at times $T_4$ to $T_6$, $T_{10}$ to $T_{12}$, $T_{16}$ to $T_{18}$, and $T_{22}$ to $T_{24}$, and sets voltage to 0 in other times is applied to the horizontal line 11.

Voltage with the amplitude b of the first voltage signal in times $T_4$ to $T_6$ overlaps voltage with the amplitude $a_2$ of the second voltage signal at the intersection with the vertical line 12 corresponding to the action V, and voltage of $a_2+b$ at most is applied to the memristor 13 arranged at the intersection. Similarly, voltages with the amplitude b of the first voltage signals in times $T_{10}$ to $T_{12}$, $T_{14}$ to $T_{18}$, and $T_{22}$ to $T_{24}$ overlap voltage with the amplitude $a_2$ of the second voltage signal at the intersections with the vertical lines 12 corresponding to the actions W, X, and Y and voltages of $a_2+b$ at most are applied to the memristors 13 arranged at the intersections. Here, if $a_2+b>V_{PT}$, ohmic values of these memristors 13 are changed, but $a_2<a_1$ is set. Thus, a change range of ohmic values of these memristors 13 becomes smaller than a change range of ohmic values of the memristors 13 connected to the horizontal line 11 corresponding to the state $S_1$. If only an ohmic value of the memristor 13 at the intersection with the vertical line 12 corresponding to the action Y is desired to be changed, and ohmic values of the other memristors 13 are desired to be decreased, it is only required that only voltage with the amplitude b at the times $T_{22}$ to $T_{24}$ is set to positive voltage, and the voltages with the amplitude b at the times $T_4$ to $T_6$, $T_{10}$ to $T_{12}$, and $T_{16}$ to $T_{18}$ are set to negative voltages. The positive/negative of voltage with the amplitude b in the first voltage signal is decided based on information stored in the action storage unit 22 corresponding to the state $s_2$, and an attribute of reward to be granted.

Because the state $S_3$ is not caused in this example, while the first voltage signal is not applied to the horizontal line 11 corresponding to the state $S_3$, the second voltage signal is applied to each of the memristors 13 connected to the horizontal line 11. Because ohmic values of these memristors 13 should not be changed, $V_{PT}>a_0>a_1>a_2$ needs to be set. In addition, as described in the example in FIG. 5, voltage with $a_i-b$ is applied to each of the memristors 13 connected to the horizontal lines 11 to which the first voltage signal is applied, but ohmic values of the memristors 13 should not be changed by the voltage. Thus, $a_i-b<V_{PT}$ is required for each $a_i$. Through the above processes, $V_{PT}>a_0>a_1>a_2>V_{PT}-b>0$ is obtained. If this is generalized, as a condition of the amplitude $a_i$ of the second voltage signal and the amplitude b of the first voltage signal, a condition represented by the following formula (2) is obtained.

$$V_{PT}>a_0>a_1> \ldots >a_{N-2}>a_{N-1}>V_{PT}-b>0 \qquad (2)$$

In the present embodiment, the voltage generator 21 corresponding to each of the states $S_j$ caused before reward is granted decides a waveform of the first voltage signal according to the action stored in the action storage unit 22 and polarity of reward, so as to satisfy the above-described formula (2), and applies the first voltage signal to the corresponding horizontal line 11. In addition, simultaneously with this, the voltage generators 31 corresponding to the respective actions apply the second voltage signal having the amplitude $a_i$ satisfying the above-described formula (2), to the vertical lines 12 with temporal differences. Ohmic values of the memristors 13 needed to be changed in ohmic value according to reward can be thereby collectively changed. In other words, changes in ohmic values of the memristors 13 can be collectively performed by reinforcement learning.

As described above, the reinforcement learning system according to the present embodiment applies the first voltage signal of a pattern having a waveform corresponding to action stored in the action storage unit 22, a time stored in the trace storage unit 23, and polarity of reward, and having predetermined amplitude, to each of the horizontal lines 11 corresponding to the respective states caused before reward is granted, and applies the second voltage signal of a pattern having amplitudes in the number corresponding to the number of action selections to be traced back, to each of the vertical lines 12 corresponding to the respective actions that can be performed by the agent, with temporal differences. Accordingly, according to the reinforcement learning system according to the present embodiment, similarly to the above-described first embodiment, reinforcement learning with a simple structure and an operating principle that uses the memristor array 10 is enabled, and required memory and calculation amount can be reduced.

According to at least one of the above-described embodiments, a reinforcement learning system that enables reinforcement learning with a simple structure and an operating principle that uses a memristor array, and can reduce required memory and calculation amount can be provided.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A reinforcement learning system comprising:
a memristor array being a crossbar memristor array in which a plurality of first direction lines and a plurality of second direction lines are arranged in an intersectional manner with memristors provided at respective intersections, each of the plurality of first direction lines corresponding to one of a plurality of states that can be caused in an environment and each of the plurality of second direction lines corresponding to one of a plurality of actions that can be performed by an agent;
a first voltage application unit configured to individually apply voltage to the plurality of first direction lines;
a second voltage application unit configured to individually apply voltage to the plurality of second direction lines;
an action decision circuit configured to decide, based on a magnitude of current flowing in the plurality of second direction lines when a readout voltage is applied to one of the plurality of first direction lines, an action to be selected by the agent in a state corresponding to the first direction line to which the readout voltage is applied;
an action storage unit configured to store, for each of the states that can be caused in the environment, an action selected by the agent in a corresponding state; and
a trace storage unit configured to store, for each of the states that can be caused in the environment, a time at which the environment enters a corresponding state, wherein
the first voltage application unit applies a first voltage signal, of a pattern corresponding to the action selected by the agent that is stored in the action storage unit and a time stored in the trace storage unit, to each of specified first direction lines among the plurality of first direction lines,
the second voltage application unit applies a second voltage signal, of a predetermined pattern, to each of the plurality of second direction lines, and
the memristor provided at an intersection of a first direction line to which the first voltage signal is applied and a second direction line to which the second voltage signal is applied undergoes a change in conductance according to a potential difference between a terminal connecting to the first direction line and a terminal connecting to the second direction line.

2. A reinforcement learning system comprising:
a memristor array being a crossbar memristor array in which a plurality of first direction lines and a plurality of second direction lines are arranged in an intersectional manner with memristors provided at respective intersections, each of the plurality of first direction lines corresponding to one of a plurality of states that can be caused in an environment and each of the plurality of second direction lines corresponding to one of a plurality of actions that can be performed by an agent;
a first voltage application unit configured to individually apply voltage to the plurality of first direction lines;
a second voltage application unit configured to individually apply voltage to the plurality of second direction lines;
an action decision circuit configured to decide, based on a magnitude of current flowing in the plurality of second direction lines when a readout voltage is applied to one of the plurality of first direction lines, an action to be selected by the agent in a state corresponding to the first direction line to which the readout voltage is applied;
an action storage unit configured to store, for each of the states that can be caused in the environment, an action selected by the agent in a corresponding state; and
a trace storage unit configured to store, for each of the states that can be caused in the environment, a time at which the environment enters a corresponding state, wherein, when a reward is granted,
the first voltage application unit applies a first voltage signal, of a pattern corresponding to the action selected by the agent that is stored in the action storage unit, a time stored in the trace storage unit, and a polarity of the reward, to each of first direction lines corresponding to respective states caused before the reward is granted among the plurality of first direction lines,
the second voltage application unit applies a second voltage signal, of a predetermined pattern, to each of the plurality of second direction lines, and
the memristor provided at an intersection of a first direction line to which the first voltage signal is applied and a second direction line to which the second voltage signal is applied undergoes a change in conductance according to a potential difference between a terminal connecting to the first direction line and a terminal connecting to the second direction line.

3. The reinforcement learning system according to claim 2, wherein, when the reward is granted, the first voltage application unit applies the first voltage signal, of a pattern having a waveform corresponding to the action selected by the agent that is stored in the action storage unit and the polarity of the reward, and having an amplitude corresponding to the time stored in the trace storage unit, to each of the first direction lines corresponding to the respective states caused before the reward is granted among the plurality of first direction lines.

4. The reinforcement learning system according to claim 3, wherein, when a number of states caused before the reward is granted is denoted by N, amplitudes of the first voltage signals to be applied to the respective first direction lines corresponding to the respective states caused before the reward is granted are denoted by $b_0$, $b_1$, $b_{N-2}$, and $b_{N-1}$ in an order of newer times stored in the trace storage unit, an amplitude of the second voltage signal is denoted by a, and a threshold voltage at which conductance of a memristor changes is denoted by $V_{PT}$,
the following relation is satisfied:

$$V_{PT} > b_0 > b_1 > \ldots > b_{N-2} > b_{N-1} > V_{PT} - a > 0.$$

5. The reinforcement learning system according to claim 2, wherein, when the reward is granted,
the first voltage application unit applies the first voltage signal, of a pattern having a waveform corresponding to the action selected by the agent that is stored in the action storage unit, the time stored in the trace storage unit, and the polarity of the reward, and having a predetermined amplitude, to each of the first direction lines corresponding to the respective states caused before the reward is granted among the plurality of first direction lines, and
the second voltage application unit applies the second voltage signal, of a pattern having amplitudes in a number corresponding to a number of action selections to be traced back, to each of the plurality of second direction lines with temporal differences.

6. The reinforcement learning system according to claim 5, wherein, when the number of action selections to be traced back is denoted by N, N amplitudes of the second voltage signal are denoted by $a_0, a_1, \ldots, a_{N-2}$, and $a_{N-1}$ in descending order, an amplitude of the first voltage signal is denoted by b, and a threshold voltage at which conductance of a memristor changes is denoted by $V_{PT}$, the following relation is satisfied:

$$V_{PT} > a_0 > a_1 > \ldots > a_{N-2} > a_{N-1} > V_{PT} - b > 0.$$

7. The reinforcement learning system according to claim 2, wherein, when the reward is granted, the first voltage application unit simultaneously applies the first voltage signals, of different patterns, to the respective first direction lines corresponding to the respective states caused before the reward is granted among the plurality of first direction lines.

* * * * *